(12) United States Patent
Sakurai et al.

(10) Patent No.: US 11,676,835 B2
(45) Date of Patent: Jun. 13, 2023

(54) SUBSTRATE PROCESSING METHOD AND SUBSTRATE PROCESSING APPARATUS

(71) Applicant: Tokyo Electron Limited, Tokyo (JP)

(72) Inventors: Hiroki Sakurai, Koshi (JP); Kazuki Kosai, Koshi (JP); Kazuyoshi Shinohara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/905,551

(22) PCT Filed: Feb. 22, 2021

(86) PCT No.: PCT/JP2021/006666
§ 371 (c)(1),
(2) Date: Sep. 2, 2022

(87) PCT Pub. No.: WO2021/177078
PCT Pub. Date: Sep. 10, 2021

(65) Prior Publication Data
US 2023/0099012 A1   Mar. 30, 2023

(30) Foreign Application Priority Data
Mar. 5, 2020   (JP) .............................. JP2020-037866

(51) Int. Cl.
*B08B 3/02*   (2006.01)
*B08B 7/04*   (2006.01)
(Continued)

(52) U.S. Cl.
CPC ........ *H01L 21/67253* (2013.01); *B08B 3/022* (2013.01); *B08B 13/00* (2013.01); *H01L 21/67023* (2013.01)

(58) Field of Classification Search
CPC ......... H01L 21/67253; H01L 21/67023; B08B 3/022; B08B 13/00
See application file for complete search history.

(56) References Cited

U.S. PATENT DOCUMENTS 6,334,902 B1 * 1/2002 Mertens ............ H01L 21/67028
134/32
6,770,151 B1 * 8/2004 Ravkin ............. H01L 21/02052
257/E21.228
(Continued)

FOREIGN PATENT DOCUMENTS

JP   2015-213105 A   11/2015
JP   2016-082227 A   5/2016

*Primary Examiner* — Alexander Markoff
(74) *Attorney, Agent, or Firm* — Armstrong Teasdale LLP

(57) ABSTRACT

A method includes: supplying a processing liquid to a center position of a substrate surface; shifting a supply position of the processing liquid from the center position to a first eccentric position; holding the supply position of the processing liquid at the first eccentric position and supplying a substitute liquid to a second eccentric position; shifting the supply position of the processing liquid in a direction away from the center position, and shifting a supply position of the substitute liquid to the center position; and supplying the processing liquid to the first eccentric position at a first flow rate, and reducing the flow rate of the processing liquid to a second flow rate after the supply position of the processing liquid starts to be shifted from the first eccentric position in the direction and until the supply position of the substitute liquid reaches the center position.

12 Claims, 10 Drawing Sheets

(51) Int. Cl.
*H01L 21/67* (2006.01)
*B08B 13/00* (2006.01)

(56) References Cited

U.S. PATENT DOCUMENTS

| | | | | |
|---|---|---|---|---|
| 7,806,989 | B2* | 10/2010 | Sekiguchi | H01L 21/67051 134/36 |
| 7,901,514 | B2* | 3/2011 | Nakamura | B08B 3/02 134/32 |
| 8,769,842 | B2* | 7/2014 | Ishibashi | H01L 21/02074 34/465 |
| 9,028,621 | B2* | 5/2015 | Miyagi | H01L 21/67051 134/30 |
| 2003/0192577 | A1* | 10/2003 | Thakur | B08B 3/024 134/146 |
| 2004/0045589 | A1* | 3/2004 | Holsteyns | H01L 21/67051 257/E21.228 |
| 2005/0208774 | A1* | 9/2005 | Fukunaga | C23G 3/027 257/E21.174 |
| 2007/0017555 | A1* | 1/2007 | Sekiguchi | B08B 3/04 134/21 |
| 2007/0223342 | A1* | 9/2007 | Orii | H01L 21/67051 369/69 |
| 2015/0243542 | A1* | 8/2015 | Yoshihara | H01L 21/68728 156/345.23 |
| 2015/0270146 | A1* | 9/2015 | Yoshihara | H01L 21/67103 134/18 |
| 2017/0047219 | A1* | 2/2017 | Shinohara | H01L 21/67028 |
| 2017/0256392 | A1* | 9/2017 | Maruyama | H01L 21/67253 |
| 2017/0292192 | A1* | 10/2017 | Iwai | C23C 18/1632 |
| 2017/0301534 | A1* | 10/2017 | Nakamori | H01L 21/02057 |
| 2018/0076018 | A1* | 3/2018 | Otsuji | B08B 3/08 |
| 2018/0195178 | A1* | 7/2018 | Otsuji | C23F 1/02 |
| 2019/0067047 | A1* | 2/2019 | Tanizawa | H01L 21/67051 |
| 2019/0196335 | A1* | 6/2019 | Harumoto | H01L 21/0271 |
| 2019/0237322 | A1* | 8/2019 | Okutani | B08B 3/106 |
| 2020/0234998 | A1* | 7/2020 | Kosugi | H01L 21/67017 |
| 2020/0365425 | A1* | 11/2020 | Morikawa | H01L 21/02054 |
| 2021/0166957 | A1* | 6/2021 | Lee | H01L 21/68 |
| 2021/0197224 | A1* | 7/2021 | Abe | B05B 1/24 |

* cited by examiner

FIG. 6

| Step | | S101 | S102 | S103 | S104 | S105 | S106 | S107 | S108 | S109 |
|---|---|---|---|---|---|---|---|---|---|---|
| Figures | | FIG. 1A | | FIG. 1B | FIG. 1C | FIG. 5A | FIG. 5B | FIG. 5C | FIG. 5D | FIG. 5E |
| Rotation speed | | | | R1 | | | | | R2(<R1) | |
| Supply position | Rinse liquid | P0 | P0→P1 | P1 | P1 | | P1→PE | | PE | – |
| | Drying liquid | – | – | | P2 | P2 | P2→P0 | P0 | P0 | |
| Flow rate | Rinse liquid | 0 | | Q1 | | | | Q2(<Q1) | | 0 |
| | Drying liquid | | | | | | Q3 | | | |

FIG. 8

| Step | | S101 | S102 | S103 | S104 | S105 | S106 | S107 | S108 | S109 |
|---|---|---|---|---|---|---|---|---|---|---|
| Figures | | FIG. 1A | | FIG. 1B | FIG. 1C | FIG. 5A | FIG. 5B | FIG. 5C | FIG. 5D | FIG. 5E |
| Rotation speed | | R1 | | | | | | | R2(<R1) | |
| Supply position | Rinse liquid | P0 | P0→P1 | P1 | | | P1→PE | | PE | — |
| | Drying liquid | | — | | | P2 | P2→P0 | | P0 | 0 |
| Flow rate | Rinse liquid | 0 | | Q1 | | | | Q2(<Q1) | | |
| | Drying liquid | | 0 | | Q3 | Q4(>Q3) | | | Q5(<Q4) | |

FIG. 9

| Step | | S101 | S102 | S103 | S104 | S105 | S106 | S107 | S108 | S109 |
|---|---|---|---|---|---|---|---|---|---|---|
| Figures | | FIG. 1A | | FIG. 1B | FIG. 1C | FIG. 5A | FIG. 5B | FIG. 5C | FIG. 5D | FIG. 5E |
| Rotation speed | | R1 | | | | R3(<R1) | | | R2(<R3<R1) | |
| Supply position | Rinse liquid | P0 | P0→P1 | P1 | | | P1→PE | | PE | - |
| | Drying liquid | - | | | P2 | P2→P0 | | P0 | | |
| Flow rate | Rinse liquid | 0 | | | Q1 | | | Q2(<Q1) | | 0 |
| | Drying liquid | | | | | Q3 | | | | |

SUBSTRATE PROCESSING METHOD AND SUBSTRATE PROCESSING APPARATUS

CROSS-REFERENCE TO RELATED APPLICATIONS

The present application is a U.S. National Stage Entry of International Patent Application No. PCT/JP2021/006666, filed Feb. 22, 2021, which claims the benefit of priority to Japanese Patent Application No. 2020-037866, filed Mar. 5, 2020, each of which is hereby incorporated herein by reference in its entirety.

TECHNICAL FIELD

The present disclosure relates to a substrate processing method and a substrate processing apparatus.

BACKGROUND

A substrate processing apparatus disclosed in Patent Document 1 supplies a processing liquid from directly above a center position of a substrate surface, forms a liquid film of the processing liquid on the entire substrate surface, supplies a substitute liquid for substituting the processing liquid from directly above the center position, and forms a liquid film of the substitute liquid on the entire substrate surface. This substrate processing apparatus replenishes the processing liquid to a position outside the supply position of the substitute liquid at the time of supplying the substitute liquid.

[Prior Art Document]
[Patent Document]
Patent Document 1: Japanese Patent No. 6118758

An aspect of the present disclosure provides a technique for suppressing generation of particles at or near a center position of a substrate surface.

SUMMARY

A substrate processing method according to an aspect of the present disclosure includes the following procedures (A) to (E): (A) supplying a processing liquid to a center position of a substrate surface of a rotating substrate; (B) shifting a supply position of the processing liquid from the center position to a first eccentric position; (C) holding the supply position of the processing liquid at the first eccentric position, and supplying a substitute liquid for substituting the processing liquid to a second eccentric position different from the first eccentric position; (D) shifting the supply position of the processing liquid from the first eccentric position in a direction away from the center position, and shifting a supply position of the substitute liquid from the second eccentric position to the center position; and (E) supplying the processing liquid to the first eccentric position at a first flow rate, and reducing the flow rate of the processing liquid from the first flow rate to a second flow rate after the supply position of the processing liquid starts to be shifted from the first eccentric position in the direction away from the center position and until the supply position of the substitute liquid reaches the center position.

According to an aspect of the present disclosure, it is possible to suppress generation of particles at or near a center position of a substrate surface.

BRIEF DESCRIPTION OF DRAWINGS

FIG. 6 is a table illustrating a substrate processing method according to an embodiment.

FIG. 8 is a table illustrating a substrate processing method according to a first modification.

FIG. 9 is a table illustrating a substrate processing method according to a second modification.

DETAILED DESCRIPTION

Figure 1A:
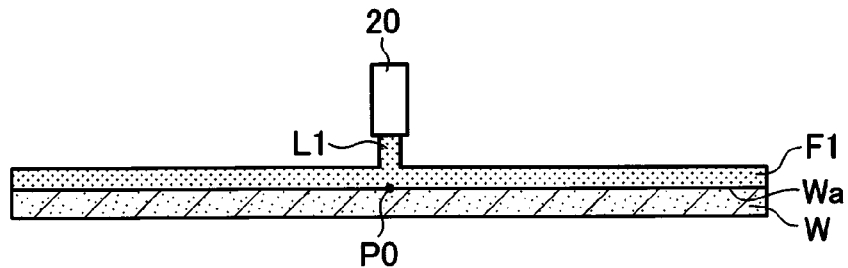
FIG. 1A is a view illustrating an example of S101 in FIG. 4.

Hereinafter, embodiments of the present disclosure will be described with reference to the drawings. In each drawing, the same or corresponding components will be denoted by the same reference numerals, and a description thereof may be omitted.

A substrate processing method includes, for example, forming a liquid film of a chemical liquid on a substrate surface, substituting the liquid film of the chemical liquid with a liquid film of a rinse liquid, substituting the liquid film of the rinse liquid with a liquid film of a drying liquid, and exposing the substrate surface from the liquid film of the drying liquid. These processes are carried out inside the same processing container.

The chemical liquid is supplied to a center of the substrate surface of the rotating substrate and spreads over the entire substrate surface in a radial direction by virtue of a centrifugal force to form a liquid film. As the chemical liquid, for example, buffered hydrofluoric acid (BHF) or the like may be used. The chemical liquid is not limited to BHF, and may be, for example, dilute hydrofluoric acid (DHF) or the like. When the BHF is used, the substrate surface is rendered water-repellent in the case where the DHF is used. A plurality of types of chemical liquids may be sequentially supplied. In this case, forming a liquid film of a rinse liquid may be performed between forming a liquid film of a first chemical liquid and forming a liquid film of a second chemical liquid.

The rinse liquid is supplied to the center of the substrate surface of the rotating substrate and spreads over the entire substrate surface in the radial direction by virtue of a centrifugal force, so that the chemical liquid contained in the liquid film is replaced with the rinse liquid. The rinse liquid washes away the chemical liquid remaining on the substrate surface. As the rinse liquid, pure water such as deionized water (DIW) may be used.

The drying liquid is supplied to the center of the substrate surface of the rotating substrate and spreads over the entire substrate surface in the radial direction by virtue of a centrifugal force, so that the rinse liquid contained in the liquid film is substituted with the drying liquid. As the drying liquid, a liquid having a lower surface tension than that of the rinse liquid may be used. This makes it possible to suppress an uneven pattern from collapsing due to the surface tension. The drying liquid is, for example, isopropyl alcohol (IPA) or the like.

After forming the liquid film of the drying liquid, the substrate surface is exposed from the liquid film of the drying liquid. The drying liquid is shaken off from the substrate surface by the rotation of the substrate. At that time, a position at which the drying liquid is supplied may be shifted from the center of the substrate surface toward a peripheral edge. By moving the supply position of the drying liquid, an opening is formed in the center of the liquid film of the drying liquid. The opening gradually expands from the center of the substrate surface toward the peripheral edge. A drying gas such as a nitrogen gas may be supplied toward an edge of the opening in order to hold the edge of the opening formed in the liquid film of the drying liquid. The supply position of the drying gas is moved following the supply position of the drying liquid.

In order to replace the liquid film, the nozzle located directly above the center position of the substrate surface is replaced. For example, in order to replace the liquid film of the rinse liquid with the liquid film of the drying liquid, the nozzle located directly above the center position of the substrate surface is replaced by a drying liquid nozzle from a rinse liquid nozzle.

The inventors of the present disclosure investigated a cause of generation of particles at or near the center position of the substrate surface, and found that the cause is that the liquid film is interrupted when the nozzle located directly above the center position of the substrate surface is replaced. It is considered that the residue of the liquid film adheres to the surface of the substrate due to such an interruption of the liquid film.

Next, with reference to FIGS. 1A to 1D, a phenomenon in which the liquid film is interrupted at or near the center position of the substrate surface when the liquid film is substituted will be described. First, as illustrated in FIG. 1A, a first nozzle 20 supplies a rinse liquid L1 to a center position P0 of a substrate surface Wa, and forms a liquid film F1 of the rinse liquid L1 on the entire substrate surface Wa.

Figure 1B:
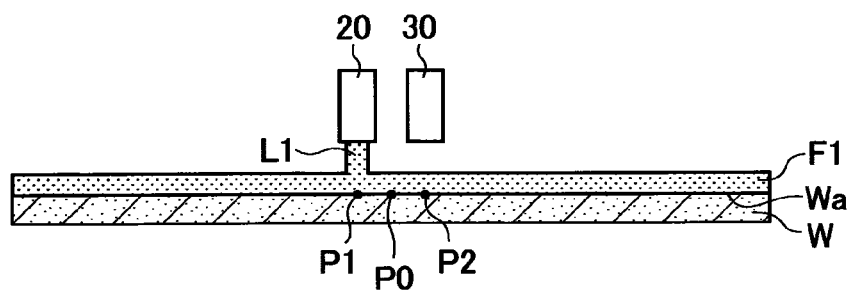
FIG. 1B is a view illustrating an example of S103 in FIG. 4.

Subsequently, as illustrated in FIG. 1B, the first nozzle 20 is moved outward in the radial direction of the substrate W, and the supply position of the rinse liquid L1 is shifted from the center position P0 to a first eccentric position P1. This is in preparation for supplying a drying liquid L2 to a second eccentric position P2 different from the first eccentric position P1, which prevents interference between a second nozzle 30 and the first nozzle 20.

The second eccentric position P2 and the first eccentric position P1 are disposed at substantially the same distance from the center position P0, but may be disposed at different distances. The second eccentric position P2 and the first eccentric position P1 are disposed near the center position P0 so that the liquid film is not interrupted at or near the center position P0.

Figure 1C:
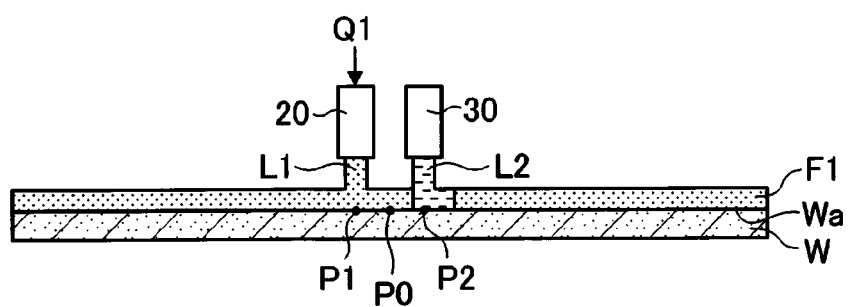
FIG. 1C is a view illustrating an example of S104 in FIG. 4.

Subsequently, as illustrated in FIG. 1C, the second nozzle 30 supplies the drying liquid L2 to the second eccentric position P2 in a state in which the supply position of the rinse liquid L1 is held at the first eccentric position P1. A flow rate of the rinse liquid L1 at this time is a first flow rate Q1. The first flow rate Q1 is set such that the liquid film is not interrupted at or near the center position P0.

Figure 1D:
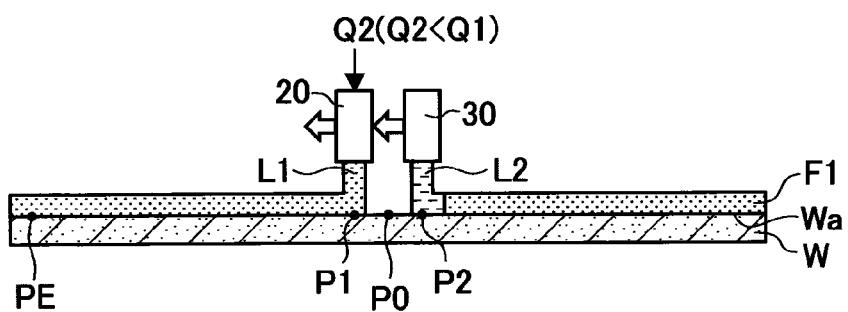
FIG. 1D is a view illustrating a reference example of a step following FIG. 1C.

Subsequently, as illustrated in FIG. 1D, the supply position of the rinse liquid L1 starts to be shifted from the first eccentric position P1 toward a peripheral edge position PE. The peripheral edge position PE is a position in a direction away from the center position P0 (outward in the radial direction) from the first eccentric position P1. In addition, the supply position of the drying liquid L2 starts to be shifted from the second eccentric position P2 toward the center position P0.

According to a reference example, as illustrated in FIG. 1D, when the supply position of the rinse liquid L1 starts to be shifted outward in the radial direction from the first eccentric position P1, the flow rate of the rinse liquid L1 is reduced from the first flow rate Q1 to a second flow rate Q2. This is to prevent liquid splashing at the supply position of the rinse liquid L1.

The farther the supply position of the rinse liquid L1 is from the center position P0, the greater the peripheral speed and centrifugal force at the supply position, and the more likely the liquid splashes at the supply position. When the flow rate of the rinse liquid L1 is reduced from the first flow rate Q1 to the second flow rate Q2 in advance, it is possible to prevent liquid from splashing at the supply position of the rinse liquid L1.

The first flow rate Q1 is, for example, 1,200 mL/min to 1,800 mL/min. The second flow rate Q2 is, for example, 800 mL/min to 1,200 mL/min. The flow rate of the rinse liquid L1 is reduced from the first flow rate Q1 to the second flow rate Q2, while a flow rate of the drying liquid L2 is maintained at a third flow rate Q3. The third flow rate Q3 is, for example, 50 mL/min to 100 mL/min.

As described above, when the flow rate of the rinse liquid L1 is reduced from the first flow rate Q1 to the second flow rate Q2 when the supply position of the rinse liquid L1 starts to be shifted outward in the radial direction from the first eccentric position P1, the liquid film may be interrupted at or near the center position P0, as illustrated in FIG. 1D. This phenomenon occurs when the substrate surface Wa is made water-repellent. This is because the rinse liquid L1 is easily peeled off from the substrate surface Wa and is easily swept outward in the radial direction by virtue of a centrifugal force. Examples of the case in which the substrate surface Wa is made water-repellent may include a case in which the substrate surface Wa is processed with high-concentration HF, a case in which the substrate surface Wa is coated with a water- repellent resist film or the like, in addition to the case in which the substrate surface is processed with BHF. This phenomenon does not occur when the substrate surface Wa is hydrophilic.

In the present embodiment, a timing T at which the flow rate of the rinse liquid L1 is reduced from the first flow rate Q1 to the second flow rate Q2 is delayed in order to cope with the case in which the substrate surface Wa is made water-repellent. The timing T is after the supply position of the rinse liquid L1 starts to be shifted outward in the radial direction from the first eccentric position P1. Since the timing T is delayed, it is also possible to supply the rinse liquid L1 to the center position P0, and it is possible to suppress the interruption of the liquid film at or near the center position P0. Therefore, it is possible to suppress the adhesion of the residue of the liquid film to the substrate surface due to the interruption of the liquid film, and it is possible to suppress the generation of particles at or near the center position P0.

Figure 5A:
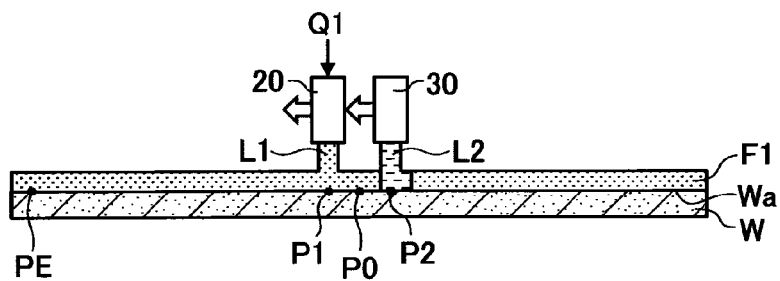
FIG. 5A is a view illustrating an example of step S105 in FIG. 4.
Figure 5B:
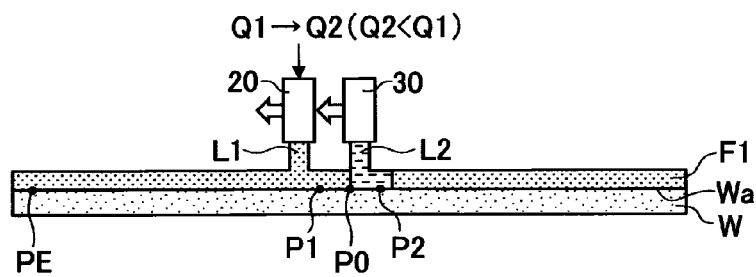
FIG. 5B is a view illustrating an example of step S106 in FIG. 4.

Until the supply position of the drying liquid L2 reaches the center position P0 after the supply position of the rinse liquid L1 starts to be shifted outward in the radial direction from the first eccentric position P1, the drying liquid L2 also reaches the center position P0, as illustrated in FIG. 5B. Therefore, until the supply position of the drying liquid L2 reaches the center position P0, the flow rate of the rinse liquid L1 is reduced from the first flow rate Q1 to the second flow rate Q2.

That is, the timing T at which the flow rate of the rinse liquid L1 is reduced from the first flow rate Q1 to the second flow rate Q2 is until the supply position of the drying liquid L2 reaches the center position P0. Since the flow rate of the rinse liquid L1 is reduced from the first flow rate Q1 to the second flow rate Q2 before the supply position of the rinse liquid L1 becomes too distant from the center position P0, it is possible to suppress the liquid from splashing at the supply position of the rinse liquid L1.

The timing T may be until the supply position of the drying liquid L2 reaches the center position P0, may be before the supply position of the drying liquid L2 reaches the center position P0, or may be when the supply position of the drying liquid L2 reaches the center position P0. However, when the timing T is before the supply position of the drying liquid L2 reaches the center position P0, it is possible to further suppress the liquid from splashing at the supply position of the rinse liquid L1.

Hereinafter, the substitution of the liquid film F1 of the rinse liquid L1 with the liquid film F2 of the drying liquid L2 will be described. The rinse liquid L1 corresponds to a processing liquid recited in the claims, and the drying liquid L2 corresponds to a substitute liquid recited in the claims.

The technique of the present disclosure is also applicable to the substitution of a liquid film of a chemical liquid with the liquid film F1 of the rinse liquid L1. In this case, the chemical liquid corresponds to a processing liquid recited in the claims, and the rinse liquid L1 corresponds to the substitute liquid recited in the claims.

Figure 2:
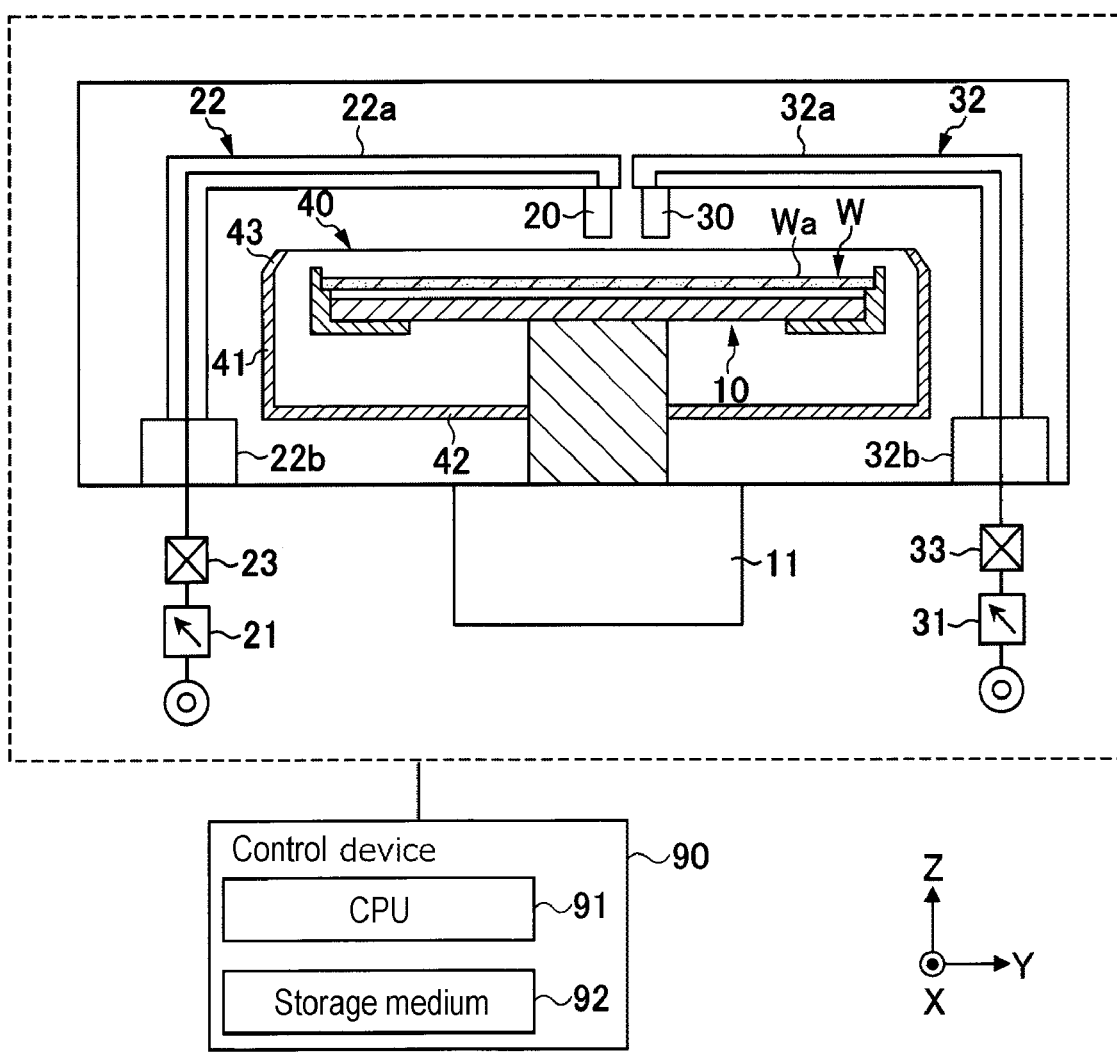
FIG. 2 is a view illustrating a substrate processing apparatus according to an embodiment.

Next, a substrate processing apparatus 1 of the present embodiment will be described with reference to FIG. 2. In FIG. 2, an X-axis direction, a Y-axis direction, and a Z-axis direction are perpendicular to one another. The X-axis direction and the Y-axis direction are horizontal directions, and the Z-axis direction is a vertical direction. The substrate processing apparatus 1 processes the substrate surface Wa. The substrate W includes, for example, a silicon wafer, a compound semiconductor wafer, or the like. The substrate W may be a glass substrate.

The substrate processing apparatus 1 includes a chuck 10, a rotation mechanism 11, a first nozzle 20, a first flow rate controller 21, a first movement mechanism 22, a second nozzle 30, a second flow rate controller 31, a second movement mechanism 32, a cup 40, and a control device 90.

The chuck 10 holds the substrate W. The chuck 10 holds the substrate W horizontally from below such that the substrate surface Wa is oriented upward. Although the chuck 10 is a mechanical chuck in FIG. 2, it may be a vacuum chuck, an electrostatic chuck, or the like.

The rotation mechanism 11 rotates the chuck 10. A rotation shaft of the chuck 10 is disposed vertically. The chuck 10 holds the substrate W such that the center of the substrate surface Wa and the rotation center line of the chuck 10 coincide with each other.

The first nozzle 20 supplies the rinse liquid L1 to the substrate surface Wa of the substrate W which is rotating. The first nozzle 20 is disposed above the chuck 10 and supplies the rinse liquid L1 to the substrate surface Wa from above. The first nozzle 20 supplies the rinse liquid L1 vertically to the substrate surface Wa.

The first flow rate controller 21 and a first opening/closing valve 23 are provided in the middle of a first supply line for supplying the rinse liquid L1 to the first nozzle 20. When the first opening/closing valve 23 opens a flow path of the rinse liquid L1, the first nozzle 20 ejects the rinse liquid L1. The flow rate of the rinse liquid L1 is controlled by the first flow rate controller 21. When the first opening/closing valve 23 closes the flow path of the rinse liquid L1, the first nozzle 20 stops the ejection of the rinse liquid L1.

Figure 3:
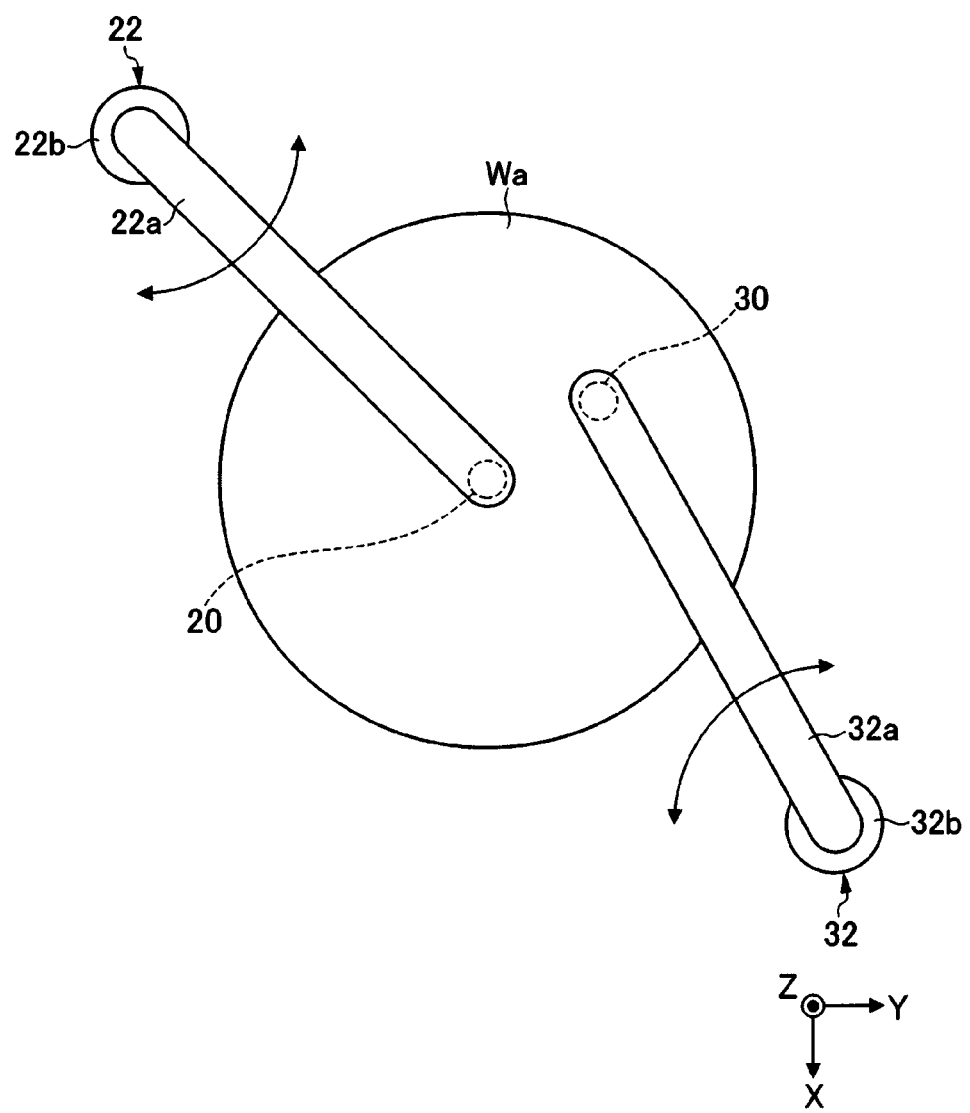
FIG. 3 is a view illustrating examples of a first movement mechanism and a second movement mechanism.

The first movement mechanism 22 moves the first nozzle 20 and shifts the supply position of the rinse liquid L1 in the radial direction of the substrate surface Wa. The first movement mechanism 22 includes, for example, a swivel arm 22a that holds the first nozzle 20 and a swivel mechanism 22b that swivels the swivel arm 22a. The swivel mechanism 22b may also serve as a mechanism for raising and lowering the swivel arm 22a. The swivel arm 22a is disposed horizontally, holds the first nozzle 20 at one end portion of the swivel arm 22a in a longitudinal direction, and is swiveled around a swivel axis extending downward from the other end portion of the swivel arm 22a in the longitudinal direction (see FIG. 3). In addition, the first movement mechanism 22 may include a guide rail and a linear motion mechanism instead of the swivel arm 22a and the swivel mechanism 22b. The guide rail is disposed horizontally, and a linear motion mechanism moves the first nozzle 20 along the guide rail.

The second nozzle 30 supplies the drying liquid L2 to the substrate surface Wa of the substrate W which is rotating. The second nozzle 30 is disposed above the chuck 10 and supplies the drying liquid L2 to the substrate surface Wa from above. The second nozzle 30 supplies the drying liquid L2 vertically to the substrate surface Wa.

The second flow rate controller 31 and a second opening/closing valve 33 are provided in the middle of the second supply line for supplying the drying liquid L2 to the second nozzle 30. When the second opening/closing valve 33 opens a flow path of the drying liquid L2, the second nozzle 30 ejects the drying liquid L2. A flow rate of the drying liquid L2 is controlled by the second flow rate controller 31. On the other hand, when the second opening/closing valve 33 closes the flow path of the drying liquid L2, the second nozzle 30 stops the ejection of the drying liquid L2.

The second movement mechanism 32 moves the second nozzle 30 and shifts the supply position of the drying liquid L2 in the radial direction of the substrate surface Wa. The second movement mechanism 32 includes, for example, a swivel arm 32a that holds the second nozzle 30 and a swivel mechanism 32b that swivels the swivel arm 32a. The swivel mechanism 32b may also serve as a mechanism for raising and lowering the swivel arm 32a. The swivel arm 32a is disposed horizontally, holds the second nozzle 30 at one end portion of the swivel arm 32a in the longitudinal direction, and is swiveled around a swivel axis extending downward from the other end portion of the swivel arm 32a in the longitudinal direction (see FIG. 3). In addition, the second movement mechanism 32 may include a guide rail and a linear motion mechanism instead of the swivel arm 32a and the swivel mechanism 32b. The guide rail is disposed horizontally, and a linear motion mechanism moves the second nozzle 30 along the guide rail.

The cup 40 accommodates the substrate W and collects the rinse liquid L1 and the drying liquid L2 that are shaken off from the substrate surface Wa. The cup 40 includes a cylindrical portion 41, a bottom cover portion 42, and an inclined portion 43. The cylindrical portion 41 has an inner diameter larger than a diameter of the substrate W and is disposed vertically. The bottom cover portion 42 closes an opening at a lower end of the cylindrical portion 41. The inclined portion 43 is formed over the entire circumference of an upper end of the cylindrical portion 41, and is inclined upward along an inward radial direction of the cylindrical portion 41.

The control device 90 controls the rotation mechanism 11, the first flow rate controller 21, the first movement mechanism 22, the second flow rate controller 31, the second movement mechanism 32, and the like. The control device 90 is, for example, a computer, and includes a central processing unit (CPU) 91 and a storage medium 92 such as a memory, as illustrated in FIG. 2. The storage medium 92 stores a program for controlling various processes to be executed in the substrate processing apparatus 1. The control device 90 controls the operation of the substrate processing apparatus 1 by causing the CPU 91 to execute the program stored in the storage medium 92.

Next, a substrate processing method of the present embodiment will be described with reference to FIGS. 4, 5A to 5E, and 6. Each step illustrated in FIG. 4 and the like is carried out under the control of the control device 90.

Figure 4:
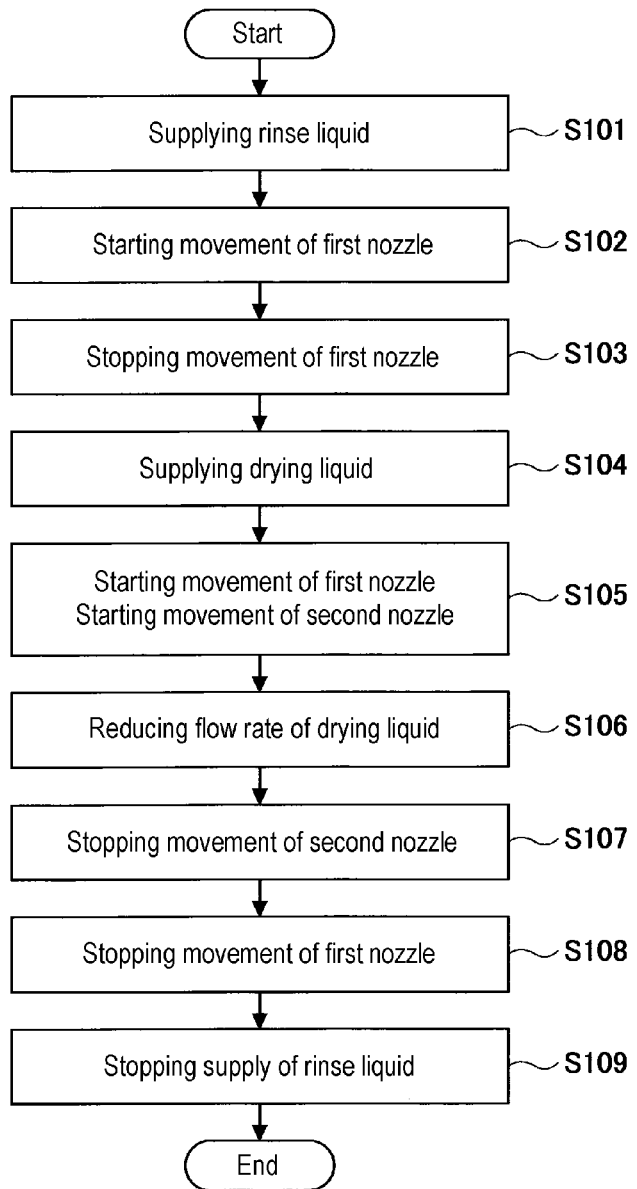
FIG. 4 is a flowchart illustrating a substrate processing method according to an embodiment.

First, in step S101 of FIG. 4, as illustrated in FIG. 1A, the first nozzle 20 supplies the rinse liquid L1 to the center position of the substrate surface Wa of the substrate W which is rotating, and forms the liquid film F1 of the rinse liquid L1 over the entire substrate surface Wa.

Subsequently, in step S102, the first movement mechanism 22 starts the movement of the first nozzle 20. The supply position of the rinse liquid L1 starts to be shifted from the center position P0 toward the first eccentric position P1.

Subsequently, as illustrated in FIG. 1B, in step S103, the first movement mechanism 22 stops the movement of the first nozzle 20 and holds the supply position of the rinse liquid L1 at the first eccentric position P1.

Subsequently, as illustrated in FIG. 1C, in step S104, the second nozzle 30 supplies the drying liquid L2 to the second eccentric position P2 in the state in which the first movement mechanism 22 holds the supply position of the rinse liquid L1 at the first eccentric position P1. The flow rate of the rinse liquid L1 at this time is the first flow rate Q1.

Subsequently, as illustrated in FIG. 5A, in step S105, the first movement mechanism 22 starts the movement of the first nozzle 20. The supply position of the rinse liquid L1 starts to be shifted outward in the radial direction from the first eccentric position P1. In addition, the second movement mechanism 32 starts the movement of the second nozzle 30. The supply position of the drying liquid L2 starts to be shifted from the second eccentric position P2 toward the center position P0.

Subsequently, in step S106, as illustrated in FIG. 5B, the first flow rate controller 21 reduces the flow rate of the rinse liquid L1 from the first flow rate Q1 to the second flow rate Q2. Since the timing T is after the supply position of the rinse liquid L1 starts to be shifted outward in the radial direction from the first eccentric position P1, it is also possible to supply the rinse liquid L1 or the drying liquid L2 to the center position P0, so that it is possible to suppress the interruption of the liquid film at or near the center position P0.

Figure 5C:
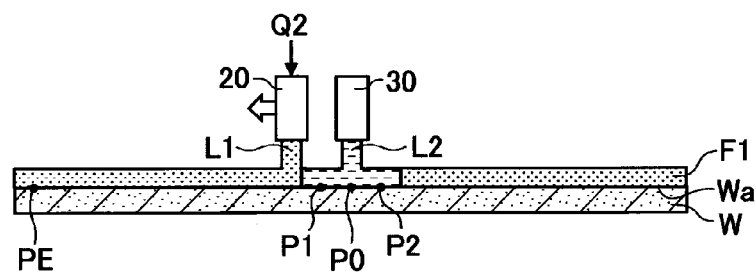
FIG. 5C is a view illustrating an example of step S107 in FIG. 4.

Subsequently, as illustrated in FIG. 5C, in step S107, when the supply position of the drying liquid L2 reaches the center position P0, the second movement mechanism 32 stops the movement of the second nozzle 30. The second nozzle 30 supplies the drying liquid L2 to the center position P0. The drying liquid L2 starts to spread from the center position P0 toward the peripheral edge position PE.

After the supply position of the drying liquid L2 reaches the center position P0, the rotation mechanism 11 may reduce a rotation speed of the substrate W from a first rotation speed R1 to a second rotation speed R2, as illustrated in FIG. 6. This is in preparation for coating the entire substrate surface Wa with the liquid film F2 of the drying liquid L2.

The drying liquid L2 has higher volatility than that of the rinse liquid L1. Therefore, by reducing the rotation speed of the substrate W, a thickness of the liquid film F2 of the drying liquid L2 is increased, the volatilization of the drying liquid L2 is suppressed, and the exposure of the substrate surface Wa is suppressed. The more radially outward the substrate surface Wa, the greater the centrifugal force acting on the liquid film F2, and the thinner the thickness of the liquid film F2. Therefore, before the drying liquid L2 spreads to the peripheral edge position PE, the rotation mechanism 11 reduces the rotation speed of the substrate W from the first rotation speed R1 to the second rotation speed R2. The first rotation speed R1 is, for example, 1,000 rpm to 1,400 rpm. The second rotation speed R2 is, for example, 500 rpm to 900 rpm.

According to the present embodiment, the supply position of the rinse liquid L1 is shifted toward the peripheral edge position PE while the supply position of the drying liquid L2 is fixed at the center position P0. When the drying liquid L2 spreads from the center position P0 to the peripheral edge position PE, it is possible to replenish the rinse liquid L1 in front of the drying liquid L2, so that it is possible to suppress the interruption of the liquid film. Therefore, it is possible to suppress the generation of particles at the peripheral edge position PE or the like.

Figure 5D:
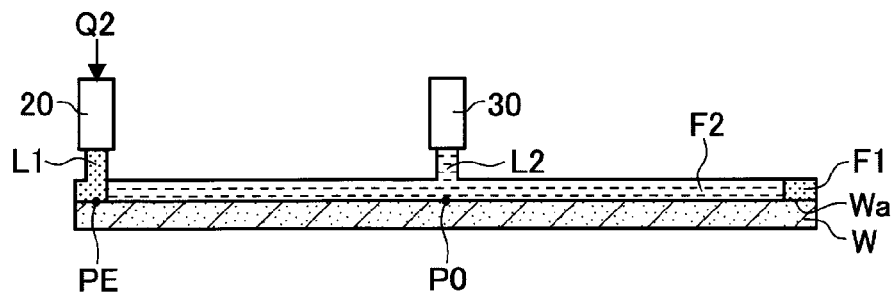
FIG. 5D is a view illustrating an example of step S108 in FIG. 4.

Subsequently, as illustrated in FIG. 5D, in step S108, when the supply position of the rinse liquid L1 reaches the peripheral edge position PE, the first movement mechanism 22 stops the movement of the first nozzle 20. The first nozzle 20 supplies the rinse liquid L1 to the peripheral edge position PE.

Figure 5E:
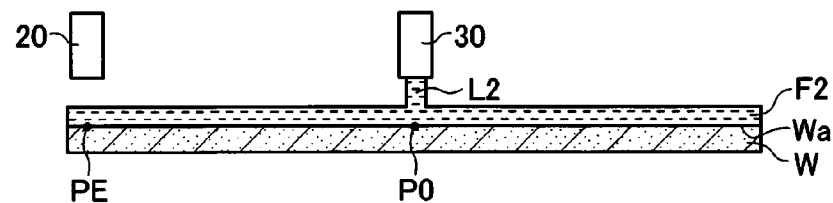
FIG. 5E is a view illustrating an example of step S109 in FIG. 4.

Lastly, as illustrated in FIG. 5E, in step S109, the first nozzle 20 stops the supply of the rinse liquid L1. As a result, the substitution of the liquid film F1 of the rinse liquid L1 with the liquid film F2 of the drying liquid L2 is completed.

Figure 7A:
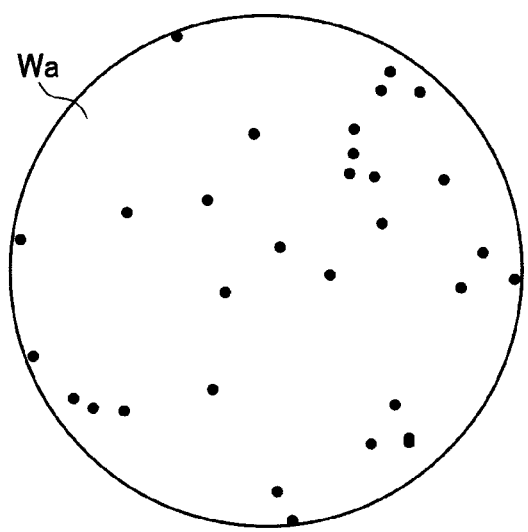
FIG. 7A is a view illustrating a distribution of particles on a substrate surface processed with the substrate processing method of FIGS. 5A to 5E.
Figure 7B:
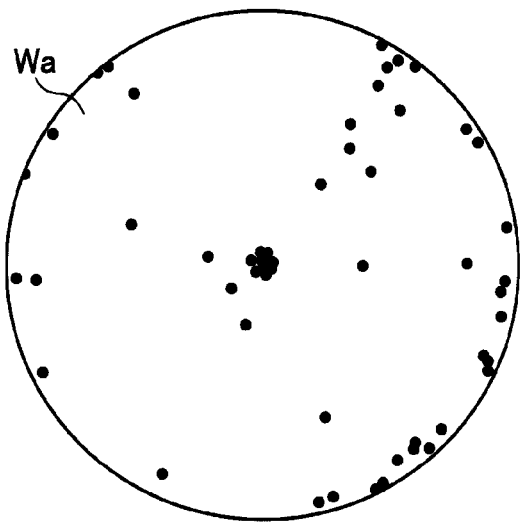
FIG. 7B is a view illustrating a distribution of particles on a substrate surface processed with the substrate processing method of FIGS. 1A to 1D.

FIG. 7A illustrates a distribution of particles on the substrate surface Wa processed with the substrate processing method of FIGS. 5A to 5E. FIG. 7B illustrates a distribution of particles on the substrate surface Wa processed with the substrate processing method of FIGS. 1A to 1D. In FIGS. 7A and 7B, the black circles are particles.

Experimental conditions in FIGS. 7A and 7B are as follows. The substrates W were silicon wafers, and the diameter of the substrate surfaces Wa was 300 mm. The substrate surfaces Wa were previously processed with BHF to make the substrate surfaces hydrophobic. The first rotation speed R1 was 1,200 rpm, the second rotation speed R2 was 700 rpm, the first flow rate Q1 was 1,500 mL/min, the second flow rate Q2 was 1,000 mL/min, and the third flow rate Q3 was 75 mL/min.

As is clear from a comparison of FIGS. 7A and 7B, it can be seen that, when the timing T at which the flow rate of the rinse liquid L1 is reduced from the first flow rate Q1 to the second flow rate Q2 is delayed, it is possible to suppress the generation of particles at or near the center position P0.

Next, a substrate processing method according to a first modification will be described with reference to FIG. 8.

Hereinafter, differences between the present modification (FIG. 8) and the above-described embodiment (FIG. 6) will be mainly described.

In the present modification, as illustrated in FIG. 8, when the supply position of the rinse liquid L1 starts to be shifted outward in the radial direction from the first eccentric position P1 (S105 of FIG. 4, FIG. 5A), the second flow rate controller 31 increases the flow rate of the drying liquid L2 from the third flow rate Q3 to a fourth flow rate Q4. The fourth flow rate Q4 is, for example, 120 mL/min to 180 mL/min.

When the supply position of the rinse liquid L1 starts to be shifted outward in the radial direction from the first eccentric position P1, the flow rate of the drying liquid L2 increases, so that the drying liquid L2 also reaches the center position P0. Therefore, it is possible to suppress the interruption of the liquid film at or near the center position P0.

Until the supply position of the drying liquid L2 reaches the center position P0, the second flow rate controller 31 reduces the flow rate of the drying liquid L2 from the fourth flow rate Q4 to a fifth flow rate Q5. The fifth flow rate Q5 is, for example, 50 mL/min to 100 mL/min. The fifth flow rate Q5 may be smaller than the fourth flow rate Q4 and may be equal to the third flow rate Q3.

In the present modification, when the supply position of the drying liquid L2 reaches the center position P0, the second flow rate controller 31 reduces the flow rate of the drying liquid L2 from the fourth flow rate Q4 to the fifth flow rate Q5. When the supply position of the drying liquid L2 reaches the center position P0, the drying liquid L2 surely reaches the center position P0.

In the present modification, as in the above-described embodiment, the timing T at which the flow rate of the rinse liquid L1 is reduced from the first flow rate Q1 to the second flow rate Q2 is after the movement of the supply position of the rinse liquid L1 outward in the radial direction from the first eccentric position P1 is started, but may be when the movement is started (see FIGS. 1A to 1D). At that time, when the flow rate of the drying liquid L2 increases from the third flow rate Q3 to the fourth flow rate Q4, it is possible to suppress the interruption of the liquid film at or near the center position P0.

Next, with reference to FIG. 9, a substrate processing method according to a second modification will be described. Hereinafter, differences between the present modification (FIG. 9) and the above-described embodiment (FIG. 6) will be mainly described.

In the present modification, as illustrated in FIG. 9, when the supply position of the rinse liquid L1 starts to be shifted outward in the radial direction from the first eccentric position P1, the rotation mechanism 11 reduces the rotation speed of the substrate W from the first rotation speed R1 to a third rotation speed R3. The third rotation speed R3 is, for example, 800 rpm to 1,200 rpm. The third rotation speed R3 may be smaller than the first rotation speed R1.

When the supply position of the rinse liquid L1 starts to be shifted outward in the radial direction from the first eccentric position P1, the rotation speed of the substrate W is reduced, so that the centrifugal force is reduced, and the rinse liquid L1 or the drying liquid L2 will also reach the center position P0. Therefore, it is possible to suppress the interruption of the liquid film at or near the center position P0.

Until the supply position of the drying liquid L2 reaches the center position P0, the rotation mechanism 11 further reduces the rotation speed of the substrate W from the third rotation speed R3 to the second rotation speed R2. The third rotation speed R3 is smaller than the first rotation speed R1 and larger than the second rotation speed R2. The second rotation speed R2 is, for example, 500 rpm to 900 rpm.

In the present modification, when the supply position of the drying liquid L2 reaches the center position P0, the rotation mechanism 11 reduces the rotation speed of the substrate W from the third rotation speed R3 to the second rotation speed R2. When the supply position of the drying liquid L2 reaches the center position P0, the drying liquid L2 surely reaches the center position P0.

Although the third rotation speed R3 in the present modification is larger than the second rotation speed R2, the third rotation speed R3 may be equal to the second rotation speed R2. This may reduce the effort of changing the rotation speed.

Further, in the present modification, as in the above-described embodiment, the timing T at which the flow rate of the rinse liquid L1 is reduced from the first flow rate Q1 to the second flow rate Q2 is after the movement of the supply position of the rinse liquid L1 outward in the radial direction from the first eccentric position P1 is started, but may be when the movement is started (see FIGS. 1A to 1D). At that time, when the rotation speed of the substrate W is reduced from the first rotation speed R1 to the third rotation speed R3, it is possible to suppress the interruption of the liquid film at or near the center position P0.

Suppressing the interruption of the liquid film at or near the center position P0 may be implemented by at least one of the following procedures (1) to (3). A combination thereof is not particularly limited, and all of the following procedures (1) to (3) may be combined with one another. (1) After the supply position of the rinse liquid L1 starts to be shifted outward in the radial direction from the first eccentric position P1, the flow rate of the rinse liquid L1 is reduced from the first flow rate Q1 to the second flow rate Q2. (2) When the supply position of the rinse liquid L1 starts to be shifted outward in the radial direction from the first eccentric position P1, the flow rate of the drying liquid L2 is increased from the third flow rate Q3 to the fourth flow rate Q4. (3) When the supply position of the rinse liquid L1 starts to be shifted outward in the radial direction from the first eccentric position P1, the rotation speed of the substrate W is reduced from the first rotation speed R1 to the third rotation speed R3.

Next, an inspection device 50 of the substrate processing apparatus 1 will be described with reference to FIG. 10. The inspection device 50 inspects wettability of the rinse liquid L1 with respect to the substrate surface Wa. For example, the inspection device 50 captures an image of the substrate surface Wa of the rotating substrate W with a camera 51 or the like in a state in which the liquid film F1 of the rinse liquid L1 is formed on the substrate surface Wa, processes the captured image, and determines the wettability depending on whether the entire substrate surface Wa is coated with the liquid film F1. The camera 51 may be installed inside a processing container that accommodates the chuck 10 or the like, or may be installed outside the processing container.

Figure 10:
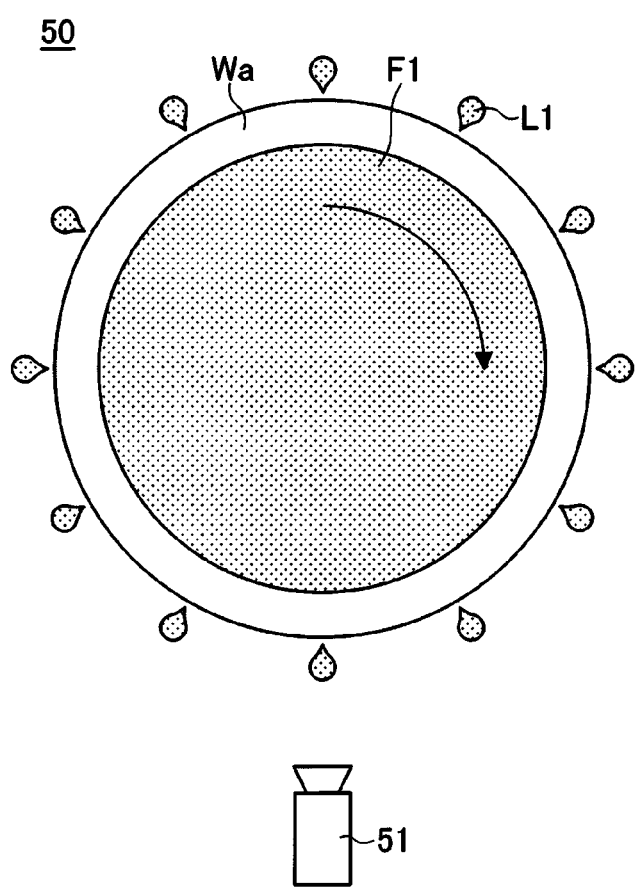
FIG. 10 is a view illustrating an example of an inspection device of a substrate processing apparatus.

As illustrated in FIG. 10, when the entire substrate surface Wa is not coated with the liquid film F1 and the peripheral edge of the substrate surface Wa is exposed from the liquid film F1, the inspection device 50 determines that the rinse liquid L1 has poor wettability with respect to the substrate surface Wa and is made water-repellent. When the substrate surface Wa is made water-repellent, the rinse liquid L1 is easily peeled off, and the peripheral edge of the substrate surface Wa is exposed. This is because the centrifugal force is larger at the peripheral edge of the substrate surface Wa than at the center. Meanwhile, when the entire substrate surface Wa is coated with the liquid film F1, the inspection device 50 determines that the rinse liquid L1 has good wettability with respect to the substrate surface Wa and is hydrophilic.

The control device 90 determines the timing T at which the flow rate of the rinse liquid L1 is reduced from the first flow rate Q1 to the second flow rate Q2 based on the inspection result of the inspection device 50. Specifically, as illustrated in FIG. 10, when the entire substrate surface Wa is not coated with the liquid film F1 and the peripheral edge of the substrate surface Wa is exposed from the liquid film F1, the timing T is set to a time after the supply position of the rinse liquid L1 starts to be shifted outward in the radial direction from the first eccentric position P1 and until the supply position of the drying liquid L2 reaches the center position P0. On the other hand, when the entire substrate surface Wa is coated with the liquid film F1, the timing T is set to a time when the supply position of the rinse liquid L1 starts to be shifted outward in the radial direction from the first eccentric position P1.

Although the embodiments or the like of the substrate processing method and the substrate processing apparatus according to the present disclosure have been described above, the present disclosure is not limited to the above-described embodiments or the like. Various changes, modifications, substitutions, additions, deletions, and combinations can be made within the scope of the claims. Of course, these also fall within the technical scope of the present disclosure.

This application claims priority based on Japanese Patent Application No. 2020-037866 filed with the Japan Patent Office on Mar. 5, 2020, and the disclosure of Japanese Patent Application No. 2020-037866 is incorporated herein in its entirety by reference.

EXPLANATION OF REFERENCE NUMERALS

L1: rinse liquid (processing liquid), L2: drying liquid (substitute liquid); Wa: substrate surface, P0: center position, P1: first eccentric position, P2: second eccentric position

What is claimed is:

1. A substrate processing method comprising:
supplying a processing liquid to a center position of a substrate surface of a rotating substrate;
shifting a supply position of the processing liquid from the center position to a first eccentric position;
holding the supply position of the processing liquid at the first eccentric position, and supplying a substitute liquid for substituting the processing liquid to a second eccentric position different from the first eccentric position;
shifting the supply position of the processing liquid from the first eccentric position in a direction away from the center position, and shifting a supply position of the substitute liquid from the second eccentric position to the center position; and
supplying the processing liquid to the first eccentric position at a first flow rate, and reducing the flow rate of the processing liquid from the first flow rate to a second flow rate after the supply position of the processing liquid starts to be shifted from the first eccentric position in the direction away from the center position and until the supply position of the substitute liquid reaches the center position.

2. The substrate processing method of claim 1, wherein a timing at which the flow rate of the processing liquid is reduced from the first flow rate to the second flow rate is before the supply position of the substitute liquid reaches the center position.

3. The plasma processing method of claim 2, further comprising:
continuously shifting the supply position of the processing liquid in the direction away from the center position in a state in which the supply position of the substitute liquid is fixed at the center position.

4. The substrate processing method of claim 3, further comprising:
supplying the substitute liquid to the second eccentric position at a third flow rate and increasing the flow rate of the substitute liquid from the third flow rate to a fourth rate when the supply position of the processing liquid starts to be shifted from the first eccentric position in the direction away from the center position.

5. The substrate processing method of claim 4, further comprising:
rotating the substrate surface at a first rotation speed when supplying the processing liquid to the first eccentric position, and reducing the rotation speed of the substrate surface to be smaller than the first rotation speed when the supply position of the processing liquid starts to be shifted from the first eccentric position in the direction away from the center position.

6. The substrate processing method of claim 5, further comprising:
inspecting wettability of the processing liquid with respect to the substrate surface; and
determining, based on a result of the inspecting the wettability, whether to set a timing at which the flow rate of the processing liquid is reduced from the first flow rate to the second flow rate to a first timing at which the supply position of the processing liquid starts to be shifted from the first eccentric position in the direction away from the center position, or to a second timing after the first timing and until the supply position of the substitute liquid reaches the center position.

7. The plasma processing method of claim 1, further comprising:
continuously shifting the supply position of the processing liquid in the direction away from the center position in a state in which the supply position of the substitute liquid is fixed at the center position.

8. The substrate processing method of claim 1, further comprising:
supplying the substitute liquid to the second eccentric position at a third flow rate and increasing the flow rate of the substitute liquid from the third flow rate to a fourth rate when the supply position of the processing liquid starts to be shifted from the first eccentric position in the direction away from the center position.

9. The substrate processing method of claim 1, further comprising:
rotating the substrate surface at a first rotation speed when supplying the processing liquid to the first eccentric position, and reducing the rotation speed of the substrate surface to be smaller than the first rotation speed when the supply position of the processing liquid starts to be shifted from the first eccentric position in the direction away from the center position.

10. The substrate processing method of claim 1, further comprising:
inspecting wettability of the processing liquid with respect to the substrate surface; and
determining, based on a result of the inspecting the wettability, whether to set a timing at which the flow rate of the processing liquid is reduced from the first flow rate to the second flow rate to a first timing at which the supply position of the processing liquid starts to be shifted from the first eccentric position in the direction away from the center position, or to a second timing after the first timing and until the supply position of the substitute liquid reaches the center position.

11. A substrate processing apparatus comprising:
a chuck configured to hold a substrate;
a rotation mechanism configured to rotate the chuck;
a first nozzle configured to supply a processing liquid to a substrate surface of the substrate which is rotating;
a first flow rate controller configured to control a flow rate of the processing liquid supplied from the first nozzle;
a first movement mechanism configured to move the first nozzle and shift a supply position of the processing liquid in a radial direction of the substrate surface;
a second nozzle configured to supply a substitute liquid to the substrate surface of the substrate which is rotating;
a second flow rate controller configured to control a flow rate of the substitute liquid supplied from the second nozzle;
a second movement mechanism configured to move the second nozzle and shift a supply position of the substitute liquid in the radial direction of the substrate surface; and
a control device configured to control the rotation mechanism, the first movement mechanism, the first flow rate controller, the second movement mechanism, and the second flow rate controller to perform the substrate processing method of claim 1.

12. The substrate processing apparatus of claim 11, further comprising:
an inspection device configured to inspect wettability of the processing liquid with respect to the substrate surface,
wherein the control device is configured to determine, based on a result of the inspecting the wettability, whether to set a timing at which the flow rate of the processing liquid is reduced from a first flow rate to a second flow rate to a first timing at which the supply position of the processing liquid starts to be shifted from a first eccentric position in a direction away from a center position, or to a second timing after the first timing and until the supply position of the substitute liquid reaches the center position.

* * * * *